United States Patent [19]
Lac et al.

[11] Patent Number: 5,337,252
[45] Date of Patent: Aug. 9, 1994

[54] DELTA-I NOISE MINIMIZATION

[75] Inventors: Quoc T. Lac, Hopewell Junction; Edward C. Lowry, Beacon; Robert B. Madden, Poughquag, all of N.Y.

[73] Assignee: International Business Machines Corporation, Armonk, N.Y.

[21] Appl. No.: 767,758

[22] Filed: Oct. 1, 1991

[51] Int. Cl.$^5$ ............................................... G06F 15/60
[52] U.S. Cl. ..................... 364/488; 364/148; 364/194; 364/491
[58] Field of Search ............... 364/468, 491, 148, 194, 364/488

[56] References Cited
U.S. PATENT DOCUMENTS

| | | | |
|---|---|---|---|
| 4,495,559 | 1/1985 | Gelatt, Jr. et al. | 364/148 |
| 4,754,408 | 6/1988 | Carpenter et al. | 364/491 |
| 4,768,154 | 8/1988 | Sliwkowski et al. | 364/491 |

Primary Examiner—Thomas G. Black
Assistant Examiner—Stephen J. Walder, Jr.
Attorney, Agent, or Firm—Whitham, Curtis & Whitham

[57] ABSTRACT

A two-step procedure for pattern assignment. The initial assignment is based on a heuristic criteria that like lines should be separated from one another to the greatest degree possible, but with a constraint that two "like" conductors should not be located in adjacent locations in the pattern if at all possible. The initial assignment pattern is then optimized by an iterative procedure to reduce Delta-I noise to a minimum. Assignments in a small sub-matrix (for example a 3x3-matrix) of the entire pattern are iteratively changed and the Delta-I noise for each iterative is determined to establish a pattern for the sub-matrix with the minimum Delta-I noise. Adjacent sub-matrices are examined in the same manner with this important criteria. Each sub-matrix after the first, overlaps at least one row or column of a previous optimized sub-matrix, and the pin assignments in the overlap portion remain frozen when optimizing the adjacent sub-matrix.

3 Claims, 3 Drawing Sheets

DELTA-I NOISE MINIMIZATION

BACKGROUND OF THE INVENTION

1. Field of the Invention

The present invention generally relates to a method for assigning power and signal locations in a three-dimensional wiring maze in order to minimize inductively coupled noise in the signal lines as a result of current changes, i.e. so-called Delta-I noise.

For ease and clarity of explanation, the invention will be described in terms of a method for assigning signal and power pins of an integrated circuit module in order to minimize Delta-I noise. Those skilled in the art will recognize that the method is generally applicable to the assignment of signal and power conductor locations in other applications where it is desirable to minimize Delta-I noise.

2. Description of the Prior Art

Delta-I noise can be a limiting factor in device switching speeds and/or the number of devices that can be switched simultaneously. In addition, it can induce false logic levels in the signal lines. Skilled engineers have developed heuristic criteria for the assignment of signal and power pins and have developed methods for the calculation of Delta-I noise for a given assignment pattern. Delta-I noise can be calculated as a function of conductor spacing, conductor diameter, conductor length, and the voltage level of a conductor relative to the voltage level of adjacent conductors.

Existing procedures for determining pin assignment patterns to limit Delta-I noise rely upon the skill and experience of the engineer and are limited by the relatively small number of Delta-I noise calculations that are practical to evaluate a proposed pattern relative to the number of possible patterns in a relatively large pattern. It will be appreciated that an array may have from five-hundred to two-thousand pins.

SUMMARY OF THE INVENTION

An object of this invention is the provision of a method for assigning power and signal pins in a wiring maze that can be used by both experienced and inexperienced designers. A method which provides repeatable results and can be used to optimize large patterns for Delta-I noise reduction.

Briefly, this invention contemplates the provision of a two-step procedure for pattern assignment. The initial assignment is based on a heuristic criteria that signal lines and "like" power lines should be separated from one another to the greatest degree practical with an added constraint that "like" conductors are not be located in adjacent locations in the pattern unless it is impractical to avoid such assignments. All signal lines are considered to be "like" conductors. In a typical module there may be a number of different power voltage and/or current lines; for example, $V_{CC}$, $V_{EE}$, $V_T$ and $V_R$. Each type of power line is considered a "like" conductor. Signal-line assignments and power line assignments for each of the like power lines are made initially by assigning lines to pins so that with each line assignment the ratio of assigned lines to line locations considered matches most closely the ratio of initial total lines of like type to initial total lines locations. Assignments are further constrained so that, where possible, "like" conductors are not assigned adjacent locations.

The initial assignment pattern is then optimized by an iterative procedure to reduce Delta-I noise to a minimum. Assignments in a small sub-matrix (for example a 3×3-matrix) of the entire pattern are iteratively changed and the Delta-I noise for each iterative is determined to establish a pattern for the sub-matrix with the minimum Delta-I noise. Adjacent sub-matrices are examined in the same manner with this important criteria- Each sub-matrix after the first, overlaps at least one row or column of a previous optimized sub-matrix, and the pin assignments in the overlap portion remain frozen when optimizing the adjacent sub-matrix. This freezing permits the optimization process to grow throughout the entire pattern.

BRIEF DESCRIPTION OF THE DRAWINGS

The foregoing and other objects, aspects and advantages will be better understood from the following detailed description of a preferred embodiment of the invention with reference to the drawings, in which:

FIG. 2 is used in explaining the initial placement algorithm.

DETAILED DESCRIPTION OF A PREFERRED EMBODIMENT OF THE INVENTION

Figure 1:
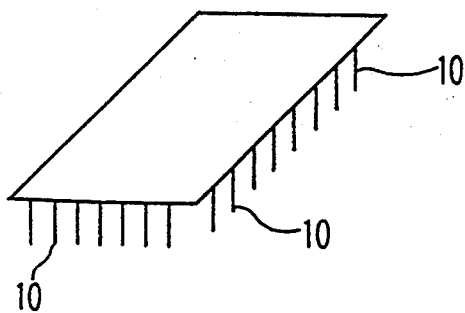
FIG. 1 is a schematic generalized view illustrating a three-dimensional wiring maze of the type to which the teachings of this invention are applicable.

Referring now to FIG. 1, the general environment in which the method of this invention is applicable in the assignment of power and signal lines in a three dimensional wiring maze of pins indicated by the reference numeral 10; for example; pin connections to an integrated circuit module. Typically, the number of pins, their pattern, their length, and their diameters are all specified. The total number of signal and power connections is also specified along with an assigned voltage level for each power line. Although the arrays shown are relatively small for illustration purposes, it will be appreciated that in actual practice the invention is particularly applicable to large arrays, for example, arrays on the order of five hundred to two thousands pins or more.

Figure 2:
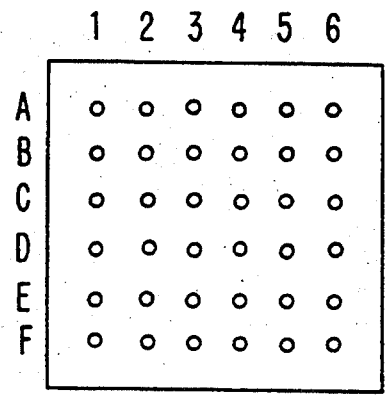
FIG. 2 is a plan view of a typical pattern of pins or the like for which signal and power line assignments are made; this

Referring now to FIG. 2, it shows for illustrative purposes a thirty-six pin array with the horizontal pin positions labeled 1 through 6 and vertical pin positions labeled A through F. This simplified illustrative example of the invention assumes twelve signal lines and twenty-four power lines. It will be appreciated that typically the total number of power lines will exceed the total number of signal lines. As explained above, the initial assignment of signal and power lines to the pins aims to separate the signal lines and like power lines from each other to the maximum extent practical. In this example, the ratio of total pin positions to total signal lines is 36 to 12. Initial signal line assignments are made in order to maintain, to the extent possible, a ratio of unconsidered pin positions to unassigned signal lines equal to the initial ratio of total pin positions to total signal lines to be placed. In order to avoid the possibility of division by zero, midway through the process the program compares the ratio of considered positions to assigned signal lines and maintains this ratio equal to the ratio of total pin positions to total signal lines. As this midway change does not alter the basic procedure, this step will be omitted from the following explanation and from the flow diagram of FIG. 3 in order to simplify and thus make clear the explanation.

For convenience the process starts in the upper left-hand corner of the matrix at position A-1 and a signal line is arbitrarily assigned to this position. Next, considering position A-2, assigning a signal line at A-2 would yield a ratio of considered positions to assigned signal lines of 34 to 10; skipping this position yields a ratio of 34 to 11. Since the ratio of 34 to 11 is closer to 36 to 12 than the ratio of 34 to 10, position A-2 is skipped and no signal line is assigned. Position A-3 is next considered; placement yields a ratio of 33 to 10 and non-placement a ratio of 33 to 11. Thus, since non-placement yields a ratio equal to the target, the non-placement option is chosen. Position A-4 yields ratios of 32 to 10 for placement and 32 to 11 for non-placement. Since 32 to 11 is closer to the target than 32 to 10, a signal line is not assigned to position A-4. Position A-5 yields a ratio, if placement is made, of 31 to 10 for placement and 31 to 11 for non-placement. The ratio of 31 to 10 is closer to the target than 31 to 11 and a signal line is assigned to position A-5. The next positions considered in order are A-6, B-1, B-2, B-3, B-4, B-5, B-6, C-1, C-2, C-3, C-4, C-5, C-6, D-1, etc. The process proceeds in this fashion once through the entire matrix, proceeding to position 6 then back to position 1 on the next column, and so on.

All signal lines are considered "like" conductors. All similar power lines are considered like conductors. The designation of similar power lines will vary with the particular semiconductor technology, i.e., CMOS, bipolar etc. The placement procedure is further constrained so that, to the extent possible, like conductors are not assigned adjacent positions. Positions are considered adjacent if they are next to the position being considered along a horizontal row or vertical column. For example, the four positions adjacent position C-3 are C-2, C-4, B-3, and D-3. If in the initial pass through the matrix, the ratio criteria selects a position adjacent a position to which a like conductor has been assigned, the position is skipped and the process proceeds to next position in which there are no like conductors in adjacent positions. For example, position B-1 yields a ratio 29 to 9 for placement and 29 to 8 for non-placement. The ratio 29 to 9 is closer to the target than 29 to 8 and position B-1 would be a candidate for assignment. However, position B-1 is adjacent to position A-1 and thus B-1 is skipped on this initial pass because all signal lines are considered to be "like" conductors. A line is assigned B-2.

Owing to the criteria that no like conductors are placed in adjacent locations in the initial pass through the matrix, all lines may not be placed in an initial pass. In this case, the matrix is examined once again starting in the upper left-hand corner at the first position that has not been previously assigned. In this second pass through the matrix, the only criteria used in considering a position for assignment is whether there is no more than one like conductor in an adjacent position. If all of the signal conductors are not assigned in the second pass, a third pass is made through the matrix; this time the only criteria is that there are no more than two like conductors in adjacent positions. If after the third pass there are unassigned conductors, a fourth pass is undertaken with the criteria of no more than three like conductors in like positions. A fifth pass, if necessary, assigns conductors to any previously unassigned positions.

Power lines are assigned using the same procedure described above for the signal lines. Each type of power line is assigned separately, starting with the power line type having the smallest number of lines. Here, in the initial pass, the target ratio is the ratio of total pin positions (in this example 36) to the number of lines of the type (for example, four (4) $V_{CC}$ lines). Only positions unassigned in a previous pass are considered. If all the power lines of a class are not placed in the initial pass, as with signal lines, a second pass is made in which the only criteria is that no more than two like conductors occupy adjacent positions. If necessary, third, fourth and fifth passes can be made in order to place all of the conductors of the class.

Figure 3:
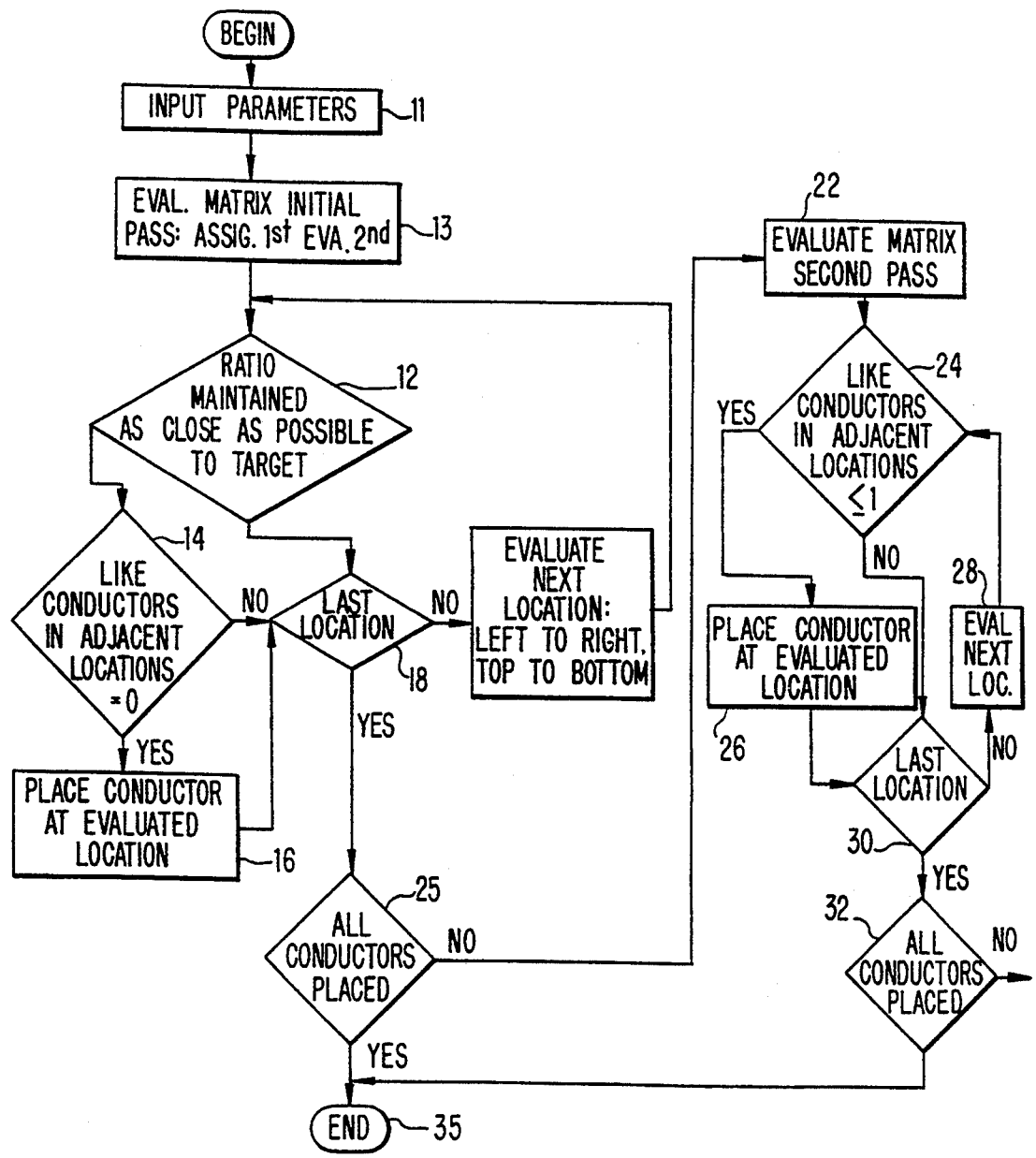
FIG. 3 is a flow diagram of an initial assignment algorithm.

FIG. 3 is a flow diagram of the process just described for establishing an assignment of signal and power lines. The program starts at block 11 with the user inputting the total number of locations in the matrix to be filled and the total number of lines of a given like type to be assigned positions in the matrix. Beginning at the upper left-hand corner of the matrix (e.g. position A-1) in the initial pass (block 13), each matrix position is evaluated first for placement of a line in a sequential order starting at the upper left-hand position and moving, for example, across the top row from left to right, across the second row from left to right, and continuing in a left-to-right row-by-row sequence until the entire matrix of positions has been considered. If the evaluated location fulfills the ratio criteria of decision block 12, it is tested in decision block 14 to determine if assigning a conductor at this location will result in like conductors in adjacent positions. If it will not, a conductor is assigned the location being evaluated in block 16. If it would result in like conductors in adjacent locations, the program advances to consider additional positions, blocks 18 and 20. When all signal conductors locations for the matrix have been evaluated, decision block 18, a test determines if all conductors have been placed, block 25. If all the conductors have not been placed, the unassigned positions of the matrix are again evaluated in a second pass through the matrix starting again in the upper left-hand corner at the first unassigned position, block 22. In the second and any subsequent pass, each unassigned position is evaluated only with respect to like conductors assigned to adjacent positions. In the second pass, the position is evaluated to determine if there is no more than one like conductor assigned to an adjacent position, decision block 24. If the number of like conductors is one or less, a conductor is assigned to this position in this pass, block 26. If not, the next vacant position is evaluated, block 28. Block 30 performs a test to determine if all unassigned positions have been evaluated and if they have, a decision is made in decision block 32 to end the procedure if all conductors of the type have been assigned positions and to proceed to a third pass if all conductors have not been placed. As explained above, the third pass and any subsequent pass that may be required to assign all conductors of a like type is essentially the same as the procedure for the second pass with the test for adjacent conductors accepting for assignment positions with two or less on the second pass, three or less on the third pass and four on the last pass. Also as explained previously, the procedure shown in FIG. 3 is carried out first for the signal conductors and then for each type of power conductor starting with the type of power conductor having the fewest lines.

Figure 4:
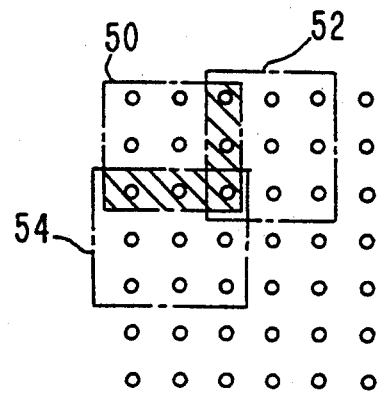
FIG. 4 is a plan view of a pin pattern similar to FIG. 2 but used in explaining the procedure in accordance with the invention for optimizing the initial pattern to minimize Delta-I noise.

Referring now to FIG. 4, after initial conductor assignments have been made for signal and power conductors, the assignments are iteratively changed in order to determine optimum assignment in terms of minimum Delta-I noise. The iterative changes and accompanying Delta-I noise calculations are carried out on a series of relatively small subsets, for example, a 3×3 subset or a 4×4 subset. In FIG. 4 a subset in the upper left-hand corner is labeled 50. The Delta-I noise for the conductors in this initial sub-matrix for iterations of conductor assignments within the sub-matrix is determined and the assignment combination which provides the least Delta-I noise within this sub-combination is selected.

Equations, known in the art can be used for determining Delta-I noise as a function of conductor length, conductor spacing, conductor diameter and assigned voltage levels. As will be appreciated by those in the art, a random number generator can be used to quickly compute a Monte Carlo solution to the equations to determine Delta-I noise for a particular pattern. See for example, "Delta-I Noise Specification for a High-Performance Computing Machine" by George A. Katopis, in *Proceedings of the IEEE*, Vol. 73, No. Sep. 9, 1985.

When an assignment pattern for the initial sub-matrix 50 has been optimized for Delta-I noise reduction, the process proceeds by optimizing in succession similar adjacent 3×3 sub-matrices along the top row. The next sub-matrix is indicated by the reference number 52. After a row is complete, the process drops to form a matrix to include positions in the lower columns, such as matrix 54. Adjacent matrices should overlap by at least one column or row as the case may be. In this example, each matrix overlaps by a single row or column with the previous matrix. The overlap positions are indicated by shading in FIG. 4. The overlapped positions from a previously optimized matrix are not varied and remain fixed when optimizing each successive matrix.

Figure 5:
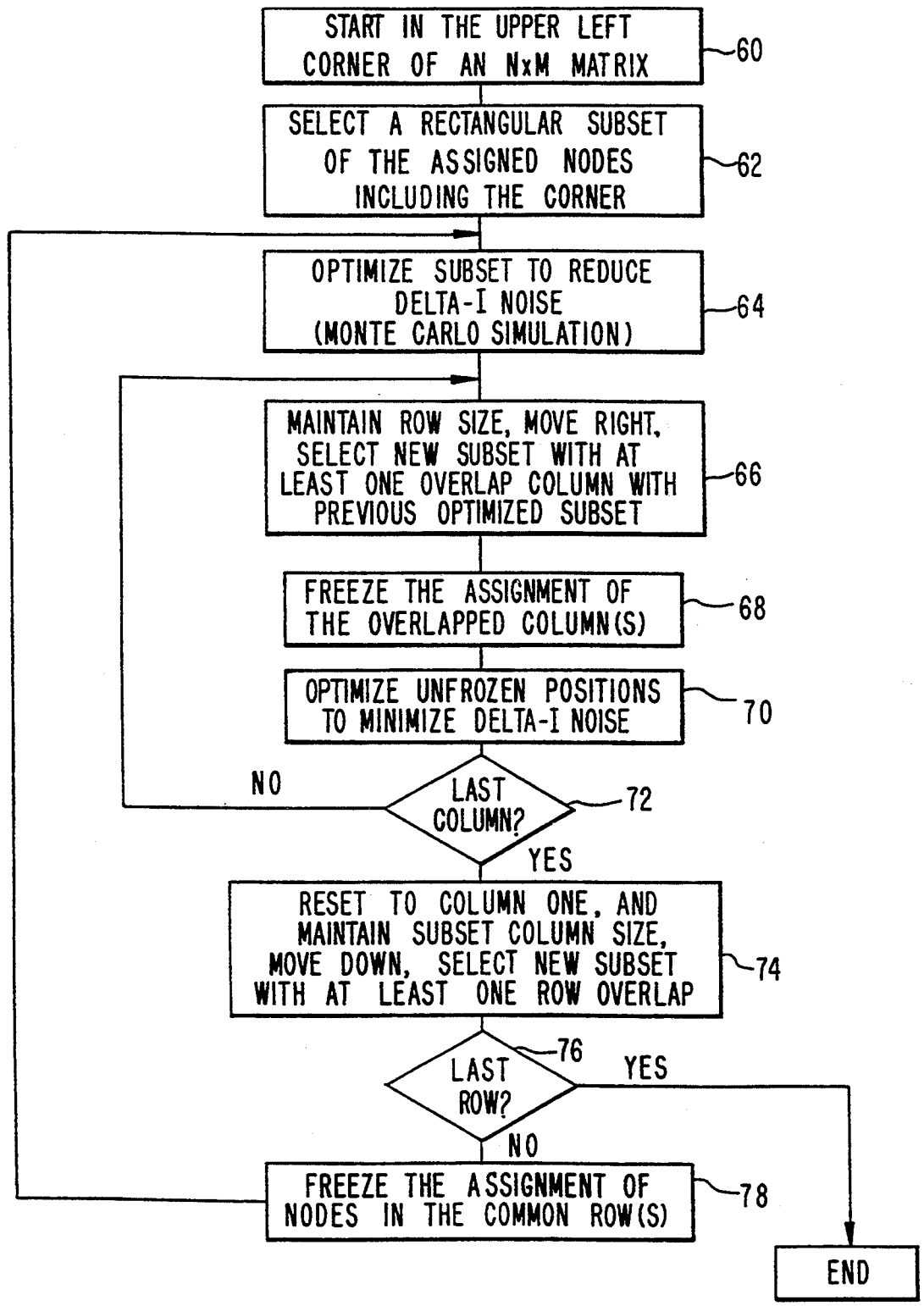
FIG. 5 is a flow diagram of a procedure in accordance with the invention to optimize the initial signal and power assignments to the pattern in order to minimize Delta-I noise.

FIG. 5 is a flow chart for the iterative testing and replacement process to optimize the assignment of signal and power leads in the matrix. The process starts at block 60 with the upper left-hand corner of the matrix in which each node position has been assigned a voltage level in accordance with tentative assignment of signal and power leads. In block 62 a rectangular subset of the matrix is defined (in this example, a 3×3 sub-matrix) and the sub-matrix is optimized (block 64) by iteratively changing the sub-matrix pattern and calculating the Delta-I noise for each pattern (by Monte Carlo Simulation for example) and choosing the pattern with the least Delta-I noise.

Next, maintaining the same row size, a new sub-matrix is defined to the right of the initial matrix with at least one overlapping column with the previously optimized subset, block 66. The assignments in the overlapped column or columns are identified as frozen positions at block 68; that is, positions whose assignments will not change in the following optimization step. The unfrozen positions in the sub-matrix are optimized at block 70 repeating the procedure of block 64.

The process repeats until all the columns of the matrix have been included in a sub-matrix (decision block 72) and then returns to the initial column and maintaining the subset column size, moves down to form a sub-matrix with at least one row overlap, block 74. The previously described process is repeated, as indicated at block 76 and 78 until the entire matrix has been optimized.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method for assigning signal and power conductor positions in a three-dimensional wiring maze, comprising the steps of:
   initially assigning signal and power conductor locations in said maze based on a criteria of spacing like conductors from one another as far as possible while avoiding where possible assigning like conductors in adjacent positions; and
   optimizing said initial assignment of signal and power conductor positions by iteratively changing assignments in a small subset of said initial assignments and testing each iteration in a subset for Delta-I noise to make a final subset assignment based on said testing of iteratively changed assignments, each of said series of small subsets having at least one row or column overlapping a row or column of a previous subset in which the conductor assignments have been finalized and in which the position assignments in said overlapping row or column are frozen during the iterative changing of assignments in subsequent subset.

2. A method for assigning signal and power conductor positions in a three-dimensional wiring maze, comprising the steps of:
   initially assigning signal lines to conductor positions by considering for assignment conductor positions based on a criteria of assigning a signal line to a considered position if an assignment maintains to an extent possible a ratio of considered positions and assigned signal lines equal to a ratio of total positions to total signal lines to be assigned but passes an assignment that meets said criteria if an assignment would result in two signal lines in adjacent conductor positions; and
   optimizing said initial assignment of signal and power conductor positions by iteratively changing assignments in a small subset of said initial assignments and testing each iteration in a subset for Delta-I noise to make a final subset assignment based on said testing of iteratively changed assignments, each of said series of small subsets having at least one row or column overlapping a row or column of a previous subset in which the conductor assignments have been finalized and in which the position assignments in said overlapping row or column are frozen during the iterative changing of assignments in subsequent subset.

3. A method for assigning signal and power conductor positions in a three-dimensional wiring maze as in claim 2, including the further step of:
   initially assigning like power lines to conductor positions by considering for assignment conductor positions based on a criteria of assigning a like power line to a considered position if an assignment maintains to an extent possible a ratio of considered positions and assigned like power lines equal to a ratio of total positions to total like power lines to be assigned but passes an assignment that meets said criteria if an assignment would result in two like power lines in adjacent conductor positions.

* * * * *